United States Patent [19]

Julien

[11] Patent Number: 5,308,367

[45] Date of Patent: * May 3, 1994

[54] TITANIUM-NITRIDE AND TITANIUM-CARBIDE COATED GRINDING TOOLS AND METHOD THEREFOR

[76] Inventor: D. Lynn Julien, 918 N. 104th St., Apache Junction, Ariz. 85220

[*] Notice: The portion of the term of this patent subsequent to Aug. 18, 2009 has been disclaimed.

[21] Appl. No.: 932,874

[22] Filed: Aug. 20, 1992

Related U.S. Application Data

[63] Continuation-in-part of Ser. No. 714,635, Jun. 13, 1991, Pat. No. 5,139,537.

[51] Int. Cl.$^5$ .............................. B24D 3/00
[52] U.S. Cl. ...................... 51/293; 51/295; 51/309
[58] Field of Search ................... 51/293, 295, 309

[56] References Cited

U.S. PATENT DOCUMENTS

| | | | |
|---|---|---|---|
| 3,464,804 | 9/1969 | Kuratomi et al. | 51/293 |
| 3,645,706 | 2/1972 | Bovenkerk | 51/295 |
| 3,650,714 | 3/1972 | Farkas | 51/295 |
| 3,859,057 | 1/1975 | Stoll et al. | 29/182.7 |
| 3,879,901 | 4/1975 | Caveney | 51/295 |
| 3,929,432 | 12/1975 | Caveney | 51/295 |
| 4,011,064 | 3/1977 | Lee et al. | 51/295 |
| 4,095,961 | 6/1978 | Wirth | 51/295 |
| 4,399,167 | 8/1983 | Pipkin | 51/309 |
| 4,776,863 | 10/1988 | Van den Berg et al. | 51/295 |
| 5,127,924 | 7/1992 | Russell | 51/295 |

*Primary Examiner*—Mark L. Bell
*Assistant Examiner*—Willie J. Thompson
*Attorney, Agent, or Firm*—Antonio R. Durando; Harry M. Weiss

[57] ABSTRACT

A titanium nitride coating (or equivalent metal or alloy) is applied over the abrasive surface of conventional CBN and diamond tools by the process of physical vapor deposition at temperatures below the tempering temperature of the core metal and below the temperature at which the difference between the coefficients of expansion of the substrate and of the abrasive causes stresses that damage the bond between them. Specific operating conditions are required during the deposition process in order to ensure the proper level of adhesion of the titanium nitride layer to the underlying material. Under these conditions, the process does not affect the integrity of the steel core of the grinding tool and the titanium nitride or equivalent coating stabilizes and reinforces the existing bond between the cubic boron nitride or diamond and the core, resulting in a grinding tool with greater efficiency and longer life. The titanium nitride layer provides a very hard coating with a low coefficient of friction that is well adhered to the underlying abrasive layer and to the layer providing the bond with the supporting substrate. As a result, during the grinding process the protective layer comes into contact with the work piece and prevents adhesion of the abrasive material with the work piece as well as loading up of the cutting surface with ground material.

15 Claims, No Drawings

TITANIUM-NITRIDE AND TITANIUM-CARBIDE COATED GRINDING TOOLS AND METHOD THEREFOR

RELATED APPLICATIONS

This application is a continuation-in-part of U.S. application Ser. No. 07/714,635, filed by the same inventor on Jun. 13, 1991, currently copending and scheduled to issue on Aug. 18, 1992, as U.S. Pat. No. 5,139,537.

BACKGROUND OF THE INVENTION

1. Field of the Invention

This invention pertains to the general field of protective substances used to coat the cutting surfaces of metal-working tools in order to improve their abrasive performance and longevity. In particular, it provides a new way of improving the performance of grinding tools by applying a thin layer of titanium nitride, titanium carbide, or other equivalent coating over the abrasive material used to coat the steel substrate of grinding tools.

2. Description of the Prior Art

Abrasive substances are used for cutting, smoothing and polishing the surface of other hard materials. Naturally, in each instance the abrasive used must be harder than the surface it is working on in order to ensure proper performance and durability. Therefore, materials known for their high degree of hardness, such as diamond, aluminum oxide and silicon carbide, have long been used as the cutting edge of tools to improve the quality of grinding, sawing, lapping, machining and drilling. These materials reduce production time and costs, and facilitate the maintenance of consistently high tolerances with little or no effect on the metallurgical integrity of the final product.

Typically, the working surface of a tool made of steel or other metallic substrate is coated with a layer of harder and more abrasion-resistant material by chemical bonding, electrometallurgical deposition, or other methods of application. Thus, in addition to the properties of the abrasive material itself, the performance of the tool is affected by the quality and durability of the bonding between the abrasive particles and the tool substrate. U.S. Pat. Nos. 3,464,804; 3,645,706; 3,650,714; 3,859,057; 3,879,901 and 3,929,432 describe several processes and products directed at improving both of these critical characteristics in grinding tools.

Because of its hardness, for a long time diamond was the preferred abrasive used for grinding very hard superalloys and composite materials, but it could not be used effectively on steels and other ferrous surfaces because of its tendency to react and be absorbed into such surfaces at the temperature and pressure conditions normally occurring in the grinding and machining process (a characteristic known as carbon solubility potential). A great improvement was achieved by the development of the synthetic superabrasive substance cubic boron nitride (CBN), marketed by the General Electric Company under the trademark "Borozon," which exhibits abrasive properties comparable to diamond and can be used effectively for grinding hardened steels. In fact, the performance of CBN is far superior to that of aluminum oxide, the conventional abrasive used on hardened steel tools.

The manufacture of most CBN grinding wheels currently found in the industry is based on four major types of bonding techniques to incorporate the CBN cutting surface into the wheel's metal core, which generally consists of steel. These techniques include resin bonding, metal bonding, vitreous bonding and electroplating. The resulting CBN-coated grinding wheels are now routinely used (generally referred to as Borozon wheels) in the machining of hard ferrous metals, cast irons, and nickel-base and cobalt-base superalloys. They can grind more material, to a higher degree of accuracy and at a lower cost, than any other abrasive. In fact, the limiting factor in the life of such tools is typically determined not by wear on the cutting surface but by its break-down and separation from the metal core resulting from failure of the bonding layer.

Therefore, any process, material, or technique that might result in the strengthening of the bond of the CBN or any other abrasive material with the supporting substrate would be of great usefulness and commercial value to the industry. The present invention deals with a new approach to strengthening the bond between the metal core (substrate) of the grinding wheel and the CBN layer on its cutting surface. The approach is based on the physical vapor deposition of a protective layer, such as titanium nitride, on the CBN-bonded surface. In addition, this invention also shows that the same process can be used to coat standard diamond tools with titanium nitride or equivalent protective layers to greatly reduce their carbon solubility.

Nitrides, carbides and other equivalent substances have been used for some time in thin coatings to provide wear protection to moving parts of equipment and machinery. This protection has become particularly critical in recent years in automated production processes, where machine break-downs caused by wear of individual parts are a significant component of overall costs. Therefore, thin layers of these materials (especially titanium nitride) have proven very successful in reducing operating costs. They are extremely hard, abrasion-resistant, and adhere well to the supporting surface even in very thin layers, which is very important for the dimensional tolerances allowed for coated parts. Such protective materials have not heretofore been used, though, to coat abrasive particles (such as CBN and diamond) that themselves are bonded to a metallic supporting substrate.

In general, the deposition of these thin layers of coating materials has been achieved at relatively high temperatures by chemical vapor deposition (CVD) and by physical vapor deposition (PVD) of a layer of the material (for example, titanium nitride) over the substrate tool. Typically, titanium nitride is deposited by chemical vapor deposition at temperatures in the order of 1,200° to 1,700° F. and by physical vapor deposition at 600° to 1,200° F. When applied to nickel-plated Borozon or diamond wheels, these temperatures tend to affect the integrity of the substrate and the stability of the abrasive-steel bond. This invention is based on the discovery that any of the several procedures known in the art as the physical vapor deposition (PVD) process can be used successfully at relatively low temperatures to produce Borozon tools coated with titanium-nitride or equivalent protective coatings for improved durability and efficiency.

This invention is further based on the recognition that titanium nitride and equivalent coatings may be used effectively also for protecting steel tools and wheels coated with diamond particles bonded to the steel substrate by means of electroplated nickel. The titanium nitride layer has shown to have the same bond-strengthening characteristics previously seen in Borozon-coated wheels. In addition, because of the presence of the buffer layer provided by the deposition of titanium nitride, the carbon solubility potential of the diamond is reduced, making it economical to use diamond tools for grinding steels and other ferrous materials.

Although the invention refers more particularly to titanium nitride, other equivalent coatings that utilize metals such as titanium, zirconium, boron and aluminum or alloyed metals like titanium-aluminum, titanium-zirconium, and chromium-aluminum in conjunction with gaseous carbon, oxygen, nitrogen, or mixtures thereof, may be equivalently utilized by those skilled in the art to produce a protective layer deposited over the abrasive medium by physical vapor deposition methods.

BRIEF SUMMARY OF THE INVENTION

One objective of this invention is the development of CBN and diamond grinding tools with improved bonding between the abrasive layer (cubic boron nitride or diamond) and the metallic substrate in order to improve the grinding efficiency and durability of the tool.

Another objective of the invention is a process for coating standard nickel-bonded Borozon and diamond wheels with titanium nitride, titanium carbide or equivalent coatings without causing distortion to the metal substrate of the tool and without weakening the nickel bond.

A further objective of this invention is the development of a coating process for grinding tools that produces a cutting surface within acceptable tolerances and does not require additional trueing of the coated tool.

Accordingly, the present invention consists of a titanium nitride coating (or equivalent metal or alloy) applied over the abrasive surface of conventional CBN and diamond tools by the process of physical vapor deposition at temperatures below the tempering temperature of the core metal and below the temperature at which the difference between the coefficients of expansion of the substrate and of the abrasive causes stresses that damage the bond between them. Specific operating conditions are required during the deposition process in order to ensure the proper level of adhesion of the titanium nitride layer to the underlying material. Under these conditions, the process does not affect the integrity of the steel core of the grinding tool and the titanium nitride or equivalent coating stabilizes and reinforces the existing bond between the cubic boron nitride or diamond and the core, resulting in a grinding tool with greater efficiency and longer life. The titanium nitride layer provides a very hard coating with a low coefficient of friction that is well adhered to the underlying abrasive layer and to the layer providing the bond with the supporting substrate. As a result, during the grinding process the protective layer comes into contact with the work piece and prevents adhesion of the abrasive material with the work piece as well as loading up of the cutting surface with ground material.

Therefore, to the accomplishment of the objectives described above, this invention consists of the features hereinafter illustrated in the examples, fully described in the detailed description of the preferred embodiment and particularly pointed out in the claims. However, such examples and description disclose but one of the various ways in which the invention may be practiced.

DETAILED DESCRIPTION OF THE INVENTION

The invention disclosed in my copending application is based on the recognition that the bond between the CBN abrasive layer and the metallic substrate of CBN grinding wheels can be greatly strengthened by the deposition of a thin layer of titanium nitride coating. The specification stated that the titanium nitride appears to penetrate the surface of the Borozon layer to bind with the molecules of the substrate, so as to create a direct bond between the exterior titanium nitride coating and the interior substrate. In fact, further experimentation has shown that not to be the case. A direct bond appears to be formed instead only with the abrasive layer (such as CBN) and with the bonding material (such as nickel electroplated onto the metallic substrate) in which the abrasive particles are embedded. The resulting effect is that the bond material (nickel) and the points of abrasive/bond interface become protected from abrasion and chemical interaction with the material being cut. Thus, the bond material is harder to fracture and remove during the grinding process and the abrasive particles are more permanently secured to it for a longer tool life.

My copending application discloses that the deposition of titanium nitride on CBN wheels can be accomplished successfully at relatively low temperatures with the arc physical-vapor-deposition process. As a result of the low temperatures used in the process, the metal substrate of the wheel is not subjected to conditions that might cause loss of hardness and distortion, as has been the case in prior attempts to protect the CBN layer of Borozon wheels with titanium nitride through other conventional higher-temperature processes, such as the chemical vapor deposition process.

As is well understood by those skilled in the art, the arc physical-vapor-deposition process is based on the ionization of metallic titanium produced by an electric arc in a low-pressure nitrogen atmosphere. Using the titanium as solid cathode material, the arc causes high-energy titanium ions to be generated in plasma form from the surface of the cathode. The ions are accelerated with high energy by a voltage bias toward the material to be coated. The titanium ions react with the free nitrogen in the system to form titanium nitride and are implanted at very high speed onto the substrate surface, resulting in a uniform thin layer of high adherence coating. During the conditioning phase of the process which preceeds the coating, a uniform high energy bombardment of the material to be coated occurs. A distance of a few nanometers of the surface is penetrated and changed to an alloy between the metal and the titanium nitride. It appears that this alloying process between the titanium ions and the CBN medium and the bonding layer produces the desired protective layer that reinforces the stability of the CBN layer on the core and, correspondingly, the life of the tool.

What is novel about this invention is the concept of using a titanium nitride coating to protect and stabilize the cubic boron nitride layer already bonded to the metal substrate (typically steel) of standard CBN grinding wheels in order to improve the characteristics of the bond, rather than improving the abrasive properties of Borozon bonded to the cutting surface of the tool. This was accomplished by the arc vapor deposition process under an unconventional set of operating conditions that for the first time made it possible to achieve good adherence of the titanium nitride protective coating over the CBN abrasive layer without affecting the structural integrity of the part. Prior attempts, conducted at the normally high operating temperatures believed to be necessary to ensure proper adherence of the titanium nitride coating, resulted in distortion and loss of hardness of the wheel's metallic core. Trials at reduced temperatures alone, without the operating conditions refinements developed for this invention, resulted in poor adherence and no measurable performance improvement in the quality of the CBN wheels so treated.

In the preferred embodiment of the invention, Borazon wheels are successfully coated with a layer of titanium nitride by the method of arc physical-vapor-deposition at very low absolute pressure and under higher than normal bias voltages in a nitrogen atmosphere. Accordingly, a standard CBN wheel, of the kind commercially available, for example, as an electroplated Norton CBN-Grade 570 wheel, is first conditioned by preheating it to a temperature of about 450° to 475° F. in an arc evaporator chamber under vacuum. This is accomplished by intense titanium ion bombardment at a high bias voltage (for example, $-1,000$ V was used with the arc evaporation process marketed by Multi-Arc Scientific Coatings of Rockaway, N.J., under the trademark "Ion Bond," but it may vary with different equipment in ways that would be obvious to those skilled in the art), which causes the surface of the wheel to absorb much of the energy carried by the ions with a resulting rise in temperature and removal of impurities from the wheel. After the part has been uniformly conditioned, the chamber is flushed with nitrogen to produce a nearly pure nitrogen atmosphere. A vacuum is then applied to reduce the absolute pressure in the chamber to about 25 millitors. The arc deposition process is then carried out at a bias voltage of approximately $-150$ V (this voltage may similarly vary depending on the equipment used and the design and volume of the material being processed) to form a titanium nitride coating 2 to 8 microns in thickness. The coated wheel is then allowed to cool in the nitrogen atmosphere in the chamber before it is retrieved.

Through a series of experiments at different temperatures, I discovered that comparable results can be achieved by also varying the level of vacuum applied to the nitrogen atmosphere in the chamber. Specifically, an acceptable degree of adhesion of the titanium nitride coating to standard CBN wheels can be obtained at operating temperatures ranging between 400° and 600° F. (both for conditioning and for deposition), with corresponding absolute pressures ranging between 30 and 10 millitors, respectively. It is found that the appropriate pressure for a given temperature is determined by linear interpolation between these two values.

Although it is anticipated that the method of this invention would improve the performance of all kinds of tools bonded with CBN and other abrasives, it was tested primarily with electroplated CBN wheels. The titanium nitride coated CBN wheels produced by the arc physical-vapor-deposition process under these conditions have shown a remarkable improvement over uncoated wheels. Tested under the same operating conditions in the performance of common grinding tasks, on the average the coated wheels demonstrated a working life (defined as the time of utilization without failure) over six times greater than that of uncoated CBN wheels. When tested at greater than normal operating feed rates (such as 0.025 linear inches per minute, where the normal rate would be 0.002 inches per minute), the titanium nitride coated wheels were able to be used efficiently without failure while standard CBN wheels failed in short order. Moreover, it was found that the coated wheels could be run successfully at much slower speeds than acceptable with uncoated wheels (such as, for example, at 3,000 rpm where the normal speed would be 6,000 rpm). This, in turn, results in the availability of more power at the cutting face of the grinding machine which makes it possible to increase the linear feed rate. In addition, because the method of deposition can be controlled to produce a layer of uniform thickness within the tolerances allowed for most grinding applications, the coated wheels can be used without further trueing or conditioning. The following examples illustrate the improvements observed in a comparison of coated versus uncoated CBN wheels.

EXAMPLE 1

This test was performed to illustrate the coated wheel's ability to grind at higher linear feed rates than permissible at a given speed for uncoated wheels.
Type of Grinding Wheel: CBN 570, 60/80 Grit
Size of Grinding Wheel: 6.5"×0.75"
Grinding Machine: Springfield Grinder, Model 42
Part Machined: Inconel 718 Stator
Linear Feed Rate: 0.025 inches per minute
Grinding Wheel Speed: 3,000 rpm
Part Table Speed: 20 rpm
The coated wheel machined 192 parts to specification before showing wear.
The uncoated wheel failed after the third part was machined.

EXAMPLE 2

This test was performed to illustrate the coated wheel's greater life when compared to an uncoated wheel under the same operating conditions.
Type of Grinding Wheel: CBN 570, 60/80 Grit
Size of Grinding Wheel: 6.0"×0.75"
Grinding machine: Springfield Grinder, Model 42
Part Machined: Inconel 718 Stator
Linear Feed Rate: 0.017 inches per minute
Grinding Wheel Speed: 3,000 rpm
Part Table Speed: 17 rpm
The coated wheel machined 213 parts to specification before showing wear.
The uncoated wheel failed after 28 parts were machined.

EXAMPLE 3

This test was performed to illustrate the coated wheel's greater life when compared to an uncoated wheel under the same operating conditions.
Type of Grinding Wheel: CBN 570, 60/80 Grit
Size of Grinding Wheel: 6.0"×0.75"
Grinding Machine: Springfield Grinder, Model 42
Part Machined: Inconel 718 Stator with Wasp Alloy Ring
Linear Feed Rate: 0.013 inches per minute
Grinding Wheel Speed: 3,000 rpm
Part Table Speed: 20 rpm
The coated wheel machined 163 parts to specification before showing wear.
The uncoated wheel failed after 23 parts were machined.

EXAMPLE 4

This test was performed to illustrate the coated wheel's greater life when compared to an uncoated wheel under the same operating conditions.
  Type of Grinding Wheel: CBN 570, 60/80 Grit
  Size of Grinding Wheel: 6.0"×0.75"
  Grinding Machine: Springfield Grinder, Model 42
  Part Machined: Mar-M Nozzle
  Linear Feed Rate: 0.002 inches per minute
  Grinding Wheel Speed: 3,000 rpm
  Part Table Speed: 17 rpm The coated wheel machined 134 parts to specification before showing wear.

The uncoated wheel failed after 26 parts were machined.

EXAMPLE 5

This test was performed to illustrate the coated wheel's greater life when compared to an uncoated wheel under the same operating conditions.
  Type of Grinding Wheel: CBN 570, 60/80 Grit
  Size of Grinding Wheel: 4.0"×0.75"
  Grinding Machine: Springfield Grinder, Model 42
  Part Machined: Inconel 713 Nozzle
  Linear Feed Rate: 0.025 inches per minute
  Grinding Wheel Speed: 6,000 rpm
  Part Table Speed: 23 rpm The coated wheel machined 263 parts to specification before showing wear.

The uncoated wheel failed after 48 parts were machined.

This concept of protecting the bonding layer between the metallic core and the abrasive medium by coating the cutting surface with titanium nitride was also used with conventional nickel-bonded diamond tools with results comparable to the ones illustrated above. On the average, titanium-nitride coated nickel-bonded diamond wheels exhibited a life at least 50 percent longer than that of uncoated wheels under the same operating conditions. The following example is typical.

EXAMPLE 6

This test was performed to illustrate a coated diamond wheel's greater life when compared to an uncoated wheel under the same operating conditions.
  Type of Grinding Wheel: Diamond, 40 Grit
  Size of Grinding Wheel: 1.0"×0.50"Shank
  Grinding Machine: Power Tool
  Part Ground: Fiberglass Material The coated diamond wheel ground 50 percent more material than an uncoated diamond wheel under the same conditions.

Additional experimentation was also conducted with other physical vapor deposition equipment, such as sputtering and electron-beam evaporation, producing good results at temperatures of approximately 700° F. and pressures in the range of 10 to 30 millitor. It appears that the critical factor in obtaining an improved coated product is a set of operating conditions that do not affect the structure of the material bonding the core of the tool to the abrasive medium (namely, the layer of electroplated nickel), nor the integrity of the bond itself. Because of the marked difference in the coefficient of thermal expansion of the various materials, high temperatures contribute to physical stresses that affect the interface and weaken the structure of the bonds between the various layers. For example, the coefficients of expansion of steel and nickel are similar, but much greater than those of Borozon and diamond. Therefore, the temperature deformation of an electroplated nickel layer is significantly different from that of the CBN or diamond bonded to it. While the bond between a steel core and a layer of electroplated nickel is not adversely affected by very high temperatures, the bond between the nickel and the abrasive layer (whether CBN or Diamond) is greatly stressed and weakened by the deformation of the material. The result is an early failure of the grinding tool because the abrasive layer is easily stripped off the cutting surface.

Recognizing the effect of high temperature stresses on the physical integrity of nickel-plated CBN and diamond tools is the critical contribution of this disclosure. Thus, it follows that a low operating temperature during the PVD coating process is important because it is necessary to preserve the integrity of the bond between the electroplated bonding layer and the abrasive layer, rather than to affect the quality of deposition of the coating layer of titanium nitride or other coating material.

Modifications to these procedures to fit particular models of CBN and diamond grinding tools would be obvious to one skilled in the art. Furthermore, various changes in the details, steps and materials that have been described may be made by those skilled in the art within the principles and scope of the invention herein illustrated and defined in the appended claims. Therefore, while the present invention has been shown and described herein in what is believed to be the most practical and preferred embodiment, it is recognized that departures can be made therefrom within the scope of the invention, which is therefore not to be limited to the details disclosed herein but is to be accorded the full scope of the claims so as to embrace any and all equivalent methods and products.

I claim:

1. A method of protecting the bond between the CBN abrasive particles embedded in the surface of a grinding tool and the bonding layer between the abrasive particles and the supporting metal substrate, comprising the following steps:
  (a) preheating the grinding tool to a temperature between 400° and 600° F. in a physical vapor deposition chamber under vacuum; and
  (b) depositing a titanium nitride coating approximately 2 to 8 microns in thickness over the CBN abrasive particles embedded in said bonding layer in the physical vapor deposition chamber, wherein the deposition is carried out in a nitrogen atmosphere under an absolute pressure between 10 and 30 millitors and at a temperature between 400° and 700° F.

2. The method defined in claim 1, wherein said bonding layer consists of electroplated nickel.

3. The method defined in claim 1, wherein said physical vapor deposition chamber consists of sputtering PVD equipment and wherein the deposition temperature is approximately 700° F.

4. The method defined in claim 1, wherein said deposition pressure is 25 millitor.

5. The method defined in claim 1, wherein said titanium-nitride coating is replaced with a coating formed utilizing a metal selected from the group consisting of titanium, zirconium, boron, aluminum, or alloys thereof in conjunction with a gas selected from the group consisting of gaseous carbon, oxygen, nitrogen, or mixtures thereof.

6. A method of protecting the bond between the diamond abrasive particles embedded in the surface of a grinding tool and the bonding layer between the abrasive particles and the supporting metal substrate, comprising the following steps:

(a) preheating the grinding tool to a temperature between 400° and 600° F. in a physical vapor deposition chamber under vacuum; and (b) depositing a titanium nitride coating approximately 2 to 8 microns in thickness over the diamond abrasive particles embedded in said bonding layer in the physical vapor deposition chamber, wherein the deposition is carried out in a nitrogen atmosphere under an absolute pressure between 10 and 30 millitors and at a temperature between 400° and 700° F.

7. The method defined in claim 6, wherein said bonding layer consists of electroplated nickel.

8. The method defined in claim 6, wherein said physical vapor deposition chamber consists of sputtering PVD equipment and wherein the deposition temperature is approximately 700° F.

9. The method defined in claim 6, wherein said deposition pressure is 25 millitor.

10. The method defined in claim 6, wherein said titanium-nitride coating is replaced with a coating formed utilizing a metal selected from the group consisting of titanium, zirconium, boron, aluminum, or alloys thereof in conjunction with a gas selected from the group consisting of gaseous carbon, oxygen, nitrogen, or mixtures thereof.

11. A grinding tool comprising:

(a) a metallic core;

(b) a layer of bonding material affixed to the surface of said metallic core;

(c) a layer of abrasive particles embedded into said bonding material and selected from the group consisting of cubic boron nitride and diamond; and (d) a layer of titanium nitride deposited over said layers of abrasive particles and bonding material in a physical vapor evaporation chamber, wherein said grinding tool is preheated to a temperature between 400° and 600° F. and wherein said layer of titanium nitride is deposited in a nitrogen atmosphere under an absolute pressure between 10 and 30 millitors and at a temperature between 400° and 600° F.

12. The grinding tool defined in claim 11, wherein said bonding layer consists of electroplated nickel.

13. The grinding tool defined in claim 11, wherein said physical vapor deposition chamber consists of sputtering PVD equipment and wherein the deposition temperature is approximately 700° F.

14. The grinding tool defined in claim 11, wherein said deposition pressure is 25 millitor.

15. The grinding tool defined in claim 11, wherein said titanium-nitride coating is replaced with a coating formed utilizing a metal selected from the group consisting of titanium, zirconium, boron, aluminum, or alloys thereof in conjunction with a gas selected from the group consisting of gaseous carbon, oxygen, nitrogen, or mixtures thereof.

* * * * *